US008710541B2

(12) United States Patent
Aherne et al.

(10) Patent No.: US 8,710,541 B2
(45) Date of Patent: Apr. 29, 2014

(54) BI-DIRECTIONAL SWITCH USING SERIES CONNECTED N-TYPE MOS DEVICES IN PARALLEL WITH SERIES CONNECTED P-TYPE MOS DEVICES

(75) Inventors: David Aherne, Limerick (IE); John O Dunlea, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 13/592,692

(22) Filed: Aug. 23, 2012

(65) Prior Publication Data

US 2013/0248923 A1 Sep. 26, 2013

Related U.S. Application Data

(60) Provisional application No. 61/613,269, filed on Mar. 20, 2012, provisional application No. 61/613,260, filed on Mar. 20, 2012.

(51) Int. Cl.
*H01L 29/66* (2006.01)
(52) U.S. Cl.
USPC .......................................... 257/121; 327/427
(58) Field of Classification Search
USPC .................................. 257/121; 327/365–566
See application file for complete search history.

(56) References Cited

U.S. PATENT DOCUMENTS

| 4,390,849 A | 6/1983 | Miskin |
| 4,568,834 A | 2/1986 | Sherman et al. |
| 4,686,383 A | 8/1987 | Croft |
| 6,163,199 A * | 12/2000 | Miske et al. .................. 327/434 |
| 6,320,448 B1 | 11/2001 | Gantioler |
| 6,509,781 B2 | 1/2003 | Dufort |
| 6,731,151 B1 | 5/2004 | Doutreloigne |
| 6,759,888 B1 | 7/2004 | Wodnicki |
| 6,927,619 B1 | 8/2005 | Doyle |
| 6,956,426 B2 | 10/2005 | Wodnicki |
| 7,521,984 B2 | 4/2009 | Ricotti |
| 7,808,222 B2 | 10/2010 | Ueunten |
| 7,952,419 B1 | 5/2011 | Birk |
| 8,427,235 B2 | 4/2013 | Williams |

(Continued)

FOREIGN PATENT DOCUMENTS

JP 2000-353944 A 12/2000

OTHER PUBLICATIONS

PCT International Search Report and Written Opinion for PCT/US2013/31248 mailed on Jun. 5, 2013.
PCT International Search Report and Written Opinion for PCT/US2013/031497 mailed on Jun. 19, 2013.

*Primary Examiner* — Shaun Campbell
(74) *Attorney, Agent, or Firm* — Kenyon & Kenyon, LLP

(57) ABSTRACT

A bi-directional switch circuit includes a pair of N-type MOS devices connected in series with a common source terminal, and a pair of P-type MOS devices connected in series with a common source terminal. The series connected N-type devices are connected in parallel with the series connected P-type devices in a configuration that includes a first input/output (I/O) point of the switch circuit being connected to a drain of a first one of the N-type devices and a drain of a first one of the P-type devices. The parallel configuration also includes a second I/O point of the switch circuit being connected to a drain of a second one of the N-type devices and a drain of a second one of the P-type devices.

9 Claims, 1 Drawing Sheet

(56) References Cited

U.S. PATENT DOCUMENTS

2005/0285665 A1 12/2005 Donaldson et al.
2008/0067325 A1 3/2008 Tani et al.
2010/0164582 A1* 7/2010 Ricotti et al. ............... 327/208
2010/0237816 A1 9/2010 Seki et al.
2011/0018508 A1 1/2011 Ueunten
2011/0148506 A1 6/2011 Korec et al.
2012/0086499 A1 4/2012 Husain et al.
2012/0299637 A1* 11/2012 Company Bosch et al. .. 327/437

* cited by examiner

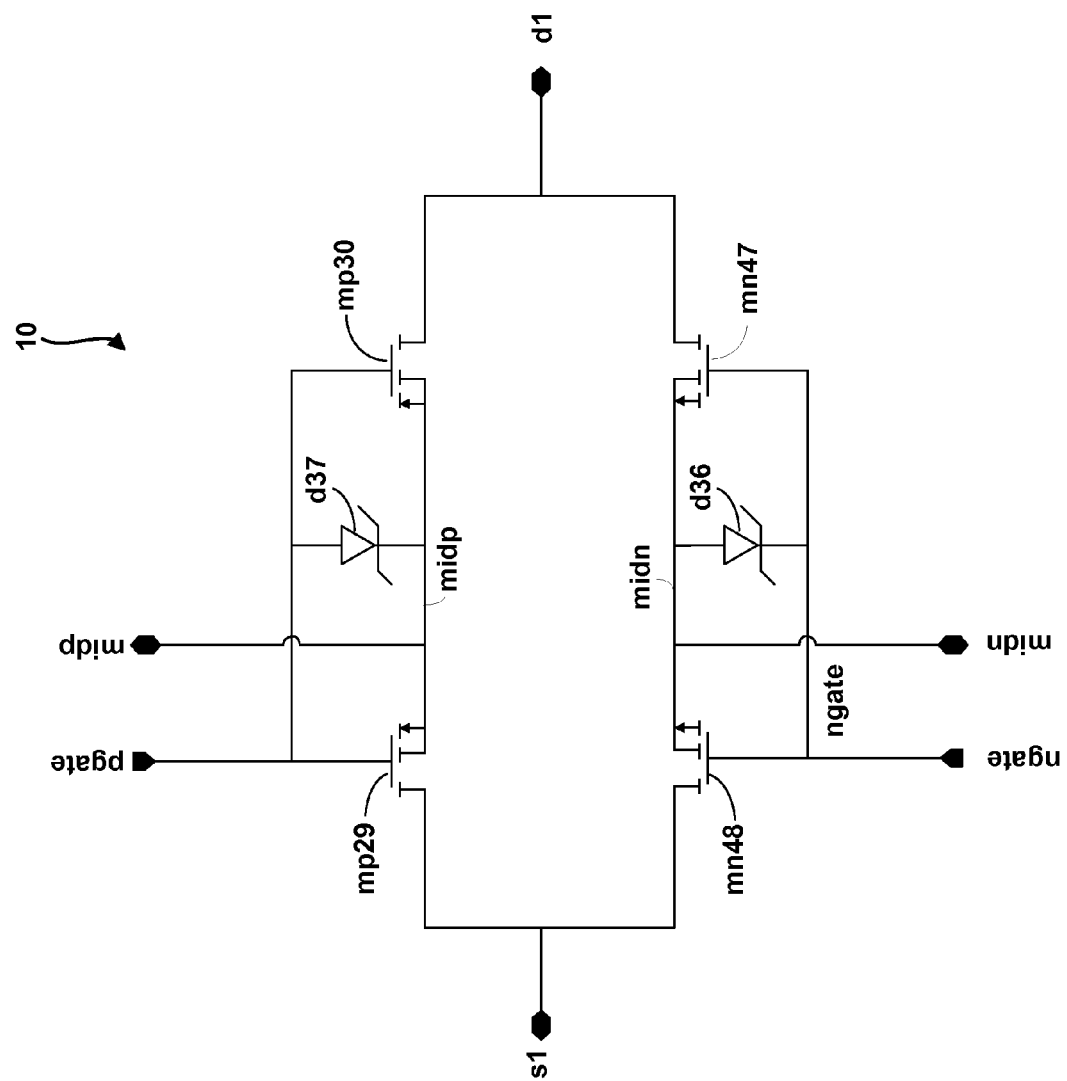

BI-DIRECTIONAL SWITCH USING SERIES CONNECTED N-TYPE MOS DEVICES IN PARALLEL WITH SERIES CONNECTED P-TYPE MOS DEVICES

CROSS-REFERENCE TO RELATED APPLICATIONS

This application claims the benefit, under 35 U.S.C. §119(e), of U.S. Provisional Patent Application No. 61/613,269 and U.S. Provisional Patent Application No. 61/613,260, both filed on Mar. 20, 2012, the contents of which are hereby incorporated by reference in its entirety. This application is also related to U.S. patent application Ser. No. 13/674,250, filed Nov. 12, 2012.

BACKGROUND INFORMATION

Two NDMOS devices can be connected in series with their sources connected to each other and their gates connected to each other to make an NDMOS switch. Two PDMOS devices can also be connected in series with their sources connected to each other and their gates connected to each other to make a PDMOS switch. However, no switches have been formed using a combination of series connected NDMOS and series connected PDMOS devices. The reason why these two types of series connections have not been combined into a single switch is that in a conventional DMOS manufacturing process one of the device types has to have its source tied to the silicon substrate. For example in a P-type silicon substrate every NDMOS device has to have its source connected to the substrate. Similarly, in an N-type silicon substrate every PDMOS device has to have its source connected to the substrate. Therefore, a plurality of processes (e.g., a conventional NDMOS process plus a conventional PDMOS process) would be required in order to form a single switch having both types of series connections—which would be costly and time consuming. Since both types of series connections would not have been used together, a parallel configuration of both types of series connections would also not have been considered feasible or practical.

A new process has been developed which allows the source of a DMOS device to be at a different potential from the substrate, thereby allowing the series connection of both NDMOS and PDMOS in the same process. Circuits that include both types of series connections, such as the bi-directional switch of the present invention, are therefore possible to manufacture with less expense.

SUMMARY

In one embodiment, a bi-directional switch is formed using a pair of series connected N-type MOS devices connected in parallel with a pair of series connected P-type MOS devices.

In a second embodiment, the bi-directional switch is a DMOS switch including a pair of series connected NDMOS devices connected in parallel with a pair of series connected PDMOS devices. One advantage of the bi-directional DMOS switch in accordance with the second embodiment is that the switch allows rail-to-rail operation without the need to use a charge pump, e.g., a charge pump to generate the gate voltage for a conventional DMOS switch. To support rail-to-rail operation, the charge pump generates a supply voltage that exceeds the maximum allowed input signal in order to keep the conventional DMOS switch turned on. Disadvantages of using the charge pump in this manner include high supply current and slow switching speed. The DMOS switch of the present invention would avoid these disadvantages.

BRIEF DESCRIPTION OF THE DRAWINGS

FIG. 1 shows a schematic of a bi-directional switch circuit according to an example embodiment of the present invention.

DETAILED DESCRIPTION OF EXAMPLE EMBODIMENTS

The present invention relates to a bi-directional switch that is formed using a pair of series connected N-type MOS devices connected in parallel with a pair of series connected P-type MOS devices. In one embodiment, the MOS devices are DMOS devices. The switch is capable of being operated as a rail-to-rail switch, meaning that the input to the switch can vary between the value of a positive supply rail (LHI) and the value of a negative supply rail (VSS) without adversely affecting switch operation. LHI and VSS are not shown in the drawings and represent the power supplies to a circuit that generates the input to the switch. For example, LHI and VSS may supply an amplifier circuit that boosts the voltage level of an input signal before the input is sent to the switch.

FIG. 1 shows a schematic of a DMOS switch 10 according to an example embodiment of the present invention. The switch 10 includes a pair of series connected PDMOS devices mp29/mp30 and a pair of series connected NDMOS devices mn47/mn48. While the example embodiments are described with respect to series connections of two MOS devices, it is possible for more than two MOS devices to be connected in series. However, the use of more than two series connected MOS devices is neither required nor necessarily preferred from the perspective of manufacturing cost and performance. Each of the series connections is formed between an input/output (I/O) point s1 and an I/O point d1. The sources of mp29 and mp30 are connected together. The gates of mp29 and mp30 are also connected together. Similarly, the sources of mn47 and mn48 are connected together, as are the gates of mn47 and mn48. The DMOS devices mp29/mp30/mn47/mn48 may be formed using an isolated process in which isolation regions are included in the silicon substrate of each DMOS device to allow the source regions of the DMOS devices to be at a differential potential from the substrate, e.g., at any voltage between LHI and VSS. Rail-to-rail operation is therefore made possible because the sources are no longer tied to the substrate potential.

The switch 10 is bi-directional, meaning s1 and d1 can be used for input as well as output. The devices mp29/mp30/mn47/mn48 are high voltage DMOS devices, suitable for use with power circuits and other circuits that operate with voltages beyond those typically found in CMOS circuits. As shown in FIG. 1, the drains of mp29 and mp48 are connected together at s1. The drains of mp30 and mn47 are connected together at d1. In this manner, the series DMOS devices are connected in parallel between the input and output of the switch 10.

The switch 10 may also include one or more protection devices that protect the DMOS devices from high voltages. For example, the switch 10 may include Zener diodes d36/d37, which operate to restrict the maximum gate-to-source voltage (Vgs) of mn47/mn48 and mp29/mp30, respectively. The diode d36 is connected between the common gate of mn47/mn48 and the common source of mn47/mn48. The diode d37 is connected between the common gate of mp29/mp30 and the common source of mp29/mp30.

The switch 10 can be operated by turning the devices mp29/mp30/mn47/mn48 on and off simultaneously through their respective gate inputs. The gates of mp29/mp30 are labeled "pgate" and the gates of mn47/mn48 are labeled "ngate". The switch 10 may also be controlled based on signals at the common sources of the DMOS devices. Specifically, a signal "midp" is obtained from the node corresponding to the common source of mp29/mp30 and a signal "midn" is obtained from the node corresponding to the common source of mn47/mn48. The functions of midp and midn are described below.

DMOS devices have a restriction on the gate-to-source voltage Vgs. The maximum allowable Vgs voltage varies depending on the manufacturing process used to make the DMOS device. In one embodiment, Vgs has a maximum allowable voltage of approximately 5.5 V. In the circuit of FIG. 1, this means that the gate voltages of the DMOS devices must be referenced to the source voltages (midp and midn, the values of which will vary depending on the input) and controlled so as to limit Vgs to the maximum allowable voltage. In the switch 10, the source voltages track the external voltage applied to the drains of the DMOS devices (s1 or d1) because of the inherent parasitic diodes that exist within the DMOS devices. For the NDMOS devices, the anode is connected to the common source (midn) and the cathode is connected to s1 for mn48 and to d1 for mn47. For the PDMOS devices, the anode is connected to the drain, which is connected to s1 for mp29 and to d1 for mp30. The cathode of the diode for the PDMOS devices is the common source (midp).

According to one embodiment, to turn on the PDMOS devices mp29/mp30, pgate must be a minimum of Vtp (the threshold voltage of the PDMOS devices) lower than midp and a maximum of 5.5 V lower than midp. In the same embodiment, to turn on the NDMOS devices, ngate must be a minimum of Vtn (the threshold voltage of the NDMOS devices) higher than midn and a maximum of 5.5 V higher than midn. If the turn-on threshold voltage for the devices Vt=Vtp=Vtn is approximately 1.2 V, a DC gate voltage of midp−5 V may be used to safely turn on the PDMOS devices while keeping within the 5.5 V limit for Vgs. Similarly, for the NDMOS devices, a gate voltage of midn+5 V may be used to safely turn on the NDMOS devices. Therefore, the drain-to-source voltage Vds can be a high voltage (e.g., Vds=80 V) while allowing the switch 10 to be turned on using a much smaller voltage (e.g., Vgs=5.5 V).

While the actual limits on Vgs may be higher or lower depending on the process used in making the DMOS devices, Vgs is preferably maintained such that it is always substantially lower than the 5.5 V maximum). The reason 5 V Vgs is used in the embodiment described above is to get the lowest on-resistance (Ron) possible. As Vgs is increased, Ron decreases. Thus, although 1.2 V would be enough Vgs to turn the devices on, performance would be significantly reduced because Ron would be high, thereby reducing the magnitude of the signal that gets passed to the output s1/d1. In sum, because midp/midn track the source voltages, the gate voltages pgate/ngate need to track midp/midn in order to keep the devices turned on.

The PDMOS devices mp29/mp30 and the NDMOS devices mn47/mn48 may be turned on or off simultaneously, i.e., all four devices are either all on or all off at any given time. To turn the devices off, Vgs of 0 V may be applied, e.g., by tying the gates to midp/midn. Specifically, midp is tied to pgate and midn is tied to ngate. When the switch 10 is off midp and midn will likely be at different voltages (i.e., midp will be the most positive voltage of s1 or d1 and midn will be the most negative voltage of s1 or d1).

In the preceding specification, the present invention has been described with reference to specific example embodiments thereof. It will, however, be evident that various modifications and changes may be made thereunto without departing from the broader spirit and scope of the present invention as set forth in the claims that follow. For example, in the example embodiments described above, DMOS devices were used because DMOS devices allow for high supply voltages. Thus, the switch 10 is especially suited for use in any application that involves use of a high voltage (e.g., a voltage from LHI to VSS of 80 V or a voltage from s1 to d1 of 80 V) or that requires a fault tolerant switch. However, in alternative embodiments, CMOS devices (e.g., N-type MOS in combination with P-type MOS) may be used instead of DMOS devices. The switch 10 may also be used in place of a conventional switch in low power applications, since it is capable of performing the same switching functions. The embodiments described herein may be presented combined with each other in various combinations. The specification and drawings are accordingly to be regarded in an illustrative rather than restrictive sense.

What is claimed is:

1. A bi-directional switch circuit, comprising:
   a pair of N-type MOS devices connected in series through a first common source terminal;
   a pair of P-type MOS devices connected in series through a second common source terminal; and
   a parallel configuration including:
     a first input/output (I/O) point of the switch circuit, connected to a drain of a first one of the N-type devices and to a drain of a first one of the P-type devices; and
     a second I/O point of the switch circuit, connected to a drain of a second one of the N-type devices and to a drain of a second one of the P-type devices;
   wherein gates of the N-type devices and the P-type devices are connected to control signals, which control signals are derived from signals at the source terminals of respective ones of the N-type and P-type devices.

2. The circuit of claim 1, wherein the MOS devices are CMOS devices.

3. The circuit of claim 1, wherein the MOS devices are DMOS devices.

4. The circuit of claim 1, wherein the MOS devices are configured to be turned on and off simultaneously.

5. The circuit of claim 1, wherein the gates of the N-type devices are connected together and the gates of the P-type devices are connected together.

6. The circuit of claim 5, further comprising:
   a Zener diode connected between the gates of the P-type devices and the second common source terminal.

7. The circuit of claim 5, further comprising:
   a Zener diode connected between the gates of the N-type devices and the first common source terminal.

8. The circuit of claim 3, wherein each DMOS device includes a silicon substrate containing an isolation region that allows the source of the DMOS device to be at a different potential than the substrate.

9. The circuit of claim 1, wherein the signals at the source terminals of respective ones of the N-type and P-type devices are voltages.

* * * * *